United States Patent
Lundberg

(10) Patent No.: US 6,965,254 B2
(45) Date of Patent: Nov. 15, 2005

(54) DYNAMIC LOGIC REGISTER

(75) Inventor: James R. Lundberg, Austin, TX (US)

(73) Assignee: IP-First, LLC, Fremont, CA (US)

( * ) Notice: Subject to any disclaimer, the term of this patent is extended or adjusted under 35 U.S.C. 154(b) by 0 days.

(21) Appl. No.: 10/730,703

(22) Filed: Dec. 5, 2003

(65) Prior Publication Data

US 2004/0113658 A1 Jun. 17, 2004

Related U.S. Application Data

(60) Provisional application No. 60/432,696, filed on Dec. 10, 2002.

(51) Int. Cl.[7] ............................................. H03K 19/096
(52) U.S. Cl. ............................ 326/98; 326/97; 327/201
(58) Field of Search ............ 326/95–98; 327/200–201; 365/203

(56) References Cited

U.S. PATENT DOCUMENTS

| | | | |
|---|---|---|---|
| 5,075,386 A | 12/1991 | Vanderbilt | |
| 5,828,234 A | 10/1998 | Sprague et al. | |
| 5,889,979 A | 3/1999 | Miller, Jr. et al. | |
| 6,498,514 B2 * | 12/2002 | Alvandpour | 326/98 |
| 6,549,038 B1 * | 4/2003 | Sechen et al. | 326/93 |
| 6,791,365 B2 * | 9/2004 | Bosshart | 326/98 |
| 2002/0158670 A1 | 10/2002 | Alvandpour | |
| 2003/0042932 A1 | 3/2003 | Bales | |
| 2003/0052714 A1 | 3/2003 | Alvandpour | |
| 2003/0110404 A1 | 6/2003 | Seningen et al. | |

FOREIGN PATENT DOCUMENTS

| | | |
|---|---|---|
| EP | 0921639 A1 | 6/1999 |
| WO | WO 99/14881 | 3/1999 |
| WO | WO 02/01328 | 1/2002 |

OTHER PUBLICATIONS

Partovi H et al: "Flow–through latch and edge–triggered flip–flop hybrid elements" Solid–State Circuits Conference, 1996. Digest of Technical Papers. 42nd ISSCC., 1996 IEEE International San Francisco, CA, USA Feb. 8–10, 1996, New York, NY, USA, IEEE, US, Feb. 8, 1996 (Feb. 8, 1996) pp. 138–139, XP010156427 ISBN: 0–7803–3136–2 "figure 8".

* cited by examiner

Primary Examiner—James H. Cho
(74) Attorney, Agent, or Firm—Gary R. Stanford; Richard K. Huffman; James W. Huffman

(57) ABSTRACT

A dynamic logic register including a dynamic circuit, a delayed inverter, a latching circuit, and a keeper circuit. The dynamic circuit pre-charges a pre-charged node while a clock signal is low and evaluates a logic function to control the state of the pre-charged node when the clock goes high. The delayed inverter provides an inverted and delayed clock. The latching circuit controls the state of an output node based on the pre-charged node during an evaluation period beginning when the clock goes high and ending when the inverted delayed clock next goes low. The latching circuit presents a tri-state condition to the output node and the keeper circuit maintains the state of the output node between evaluation periods. The register is very fast with zero setup and short data-to output-time, and may be used between stages in a pipeline system.

20 Claims, 5 Drawing Sheets

DYNAMIC LOGIC REGISTER

CROSS-REFERENCE TO RELATED APPLICATIONS

This application claims the benefit of U.S. Provisional Application No. 60/432,696, filed on Dec. 10, 2002, which is herein incorporated by reference for all intents and purposes.

This application is related to the following co-pending U.S. patent application, which is filed on the same day as this application, which has a common assignee and at least one common inventor, and which is herein incorporated by reference in its entirety for all intents and purposes:

| Ser. No. | DOCKET NUMBER | TITLE |
|---|---|---|
| 10/730,168 | CNTR.2197 | DYNAMIC LOGIC RETURN-TO-ZERO LATCHING MECHANISM |

BACKGROUND OF THE INVENTION

1. Field of the Invention

The present invention relates to dynamic logic and register functions, and more particularly to a dynamic logic register that provides registered outputs for logic evaluation functions.

2. Description of the Related Art

Integrated circuits use a remarkable number of registers, particularly those having a synchronous pipeline architecture. Register logic is employed to hold the outputs of devices and circuits for a period of time so that these outputs can be received by other devices and circuits. In a clocked system, such as a pipeline microprocessor, registers are used to latch and hold the outputs of a given pipeline stage for a period of one clock cycle so that input circuits in a subsequent stage can receive the outputs during that period while the given pipeline stage is concurrently generating new outputs.

In the past, it has been common practice to precede and follow complex logical evaluation circuits, such as multiple input multiplexers (muxes), multi-bit encoders, etc., with registers to hold the inputs to and the outputs from the evaluation circuits. Generally, these registers have associated setup and hold time requirements, both of which constrain the evaluation circuits in the preceding stage. In addition, registers have corresponding clock-to-output time characteristics, which constrain the evaluation circuits in subsequent stages. The "speed" of a register is typically judged in terms of its data-to-output time, that is, the sum of its setup time and clock-to-output time.

Preceding and following a logical evaluation circuit with traditional register circuits introduces delays into a pipeline system whose cumulative effect results in significantly slower operating speeds. More specifically, one notable source of these delays is the setup time requirements that must be satisfied by logical evaluation circuits in order to ensure stable registered outputs. It is desired to reduce these delays to provide additional time in each stage and to thereby increase overall speed of the pipeline system.

SUMMARY OF THE INVENTION

A dynamic logic register according to an embodiment of the present invention includes a complementary pair of evaluation devices responsive to a clock signal, a dynamic evaluator, delayed inversion logic, latching logic, and a keeper circuit. The dynamic evaluator is coupled between the complementary pair of evaluation devices at a pre-charged node, and evaluates a logic function based on at least one input data signal. The delayed inversion logic receives the clock signal and outputs a complete signal, which is a delayed and inverted version of the clock signal. The latching logic is responsive to the clock and complete signals and the state of the pre-charged node, and controls the state of an output node based on the state of the pre-charged node during an evaluation period between an operative edge of the clock signal and the next edge of the complete signal. Otherwise, the latching logic presents a tri-state condition to the output node between evaluation periods. The keeper circuit is coupled to the output node to maintain the state of the output node between evaluation periods.

The use of P-channel and N-channel devices is contemplated for implementing portions of the dynamic logic register. For example, the complementary pair of evaluation devices may comprise a P-channel device and an N-channel device. The latching logic may include P-channel pull-up and N-channel pull-down devices. The dynamic evaluator may include a logic circuit for evaluating a selected logic function, which may range from very simple to very complex. The delayed inversion logic may be a chain of one or more inverters depending upon specific timing parameters and the fabrication process employed. Qualifying logic and/or additional logic may be used to temporarily suspend operation, or maintain an output, or to otherwise prevent a selected state of the output. An output buffer/inverted may be provided at the output for buffering the output signal.

In a specific embodiment, the latching logic includes a plurality of P-channel and N-channel devices to perform the desired latching function. In one embodiment, for example, the latching logic includes an N-channel pass device, first and second P-channel pull-up devices, and a plurality of N-channel pull-down devices. The N-channel pass device has a gate receiving the complete signal and a drain and source coupled between the pre-charged node and a pull-up control node. The first P-channel pull-up device has a gate receiving the complete signal and a drain and source coupled between a source voltage and the pull-up control node. The second P-channel pull-up device has a gate coupled to the pull-up control node and a drain and source coupled between the source voltage and the output node. The plurality of N-channel pull-down devices are coupled between the output node and ground and are controlled by the complete signal, the clock signal and the pre-charged node.

A dynamic latch circuit according to an embodiment of the present invention includes a dynamic circuit, a delayed inverter, a latching circuit, and a keeper circuit. The dynamic circuit pre-charges a first node while a clock signal is low and evaluates a logic function for controlling the state of the first node when the clock signal goes high. The delayed inverter receives the clock signal and provides an inverted delayed clock signal. The latching circuit controls the state of an output node based on the state of the first node during an evaluation period beginning when the clock signal goes high and ending when the inverted delayed clock signal next goes low. The latching circuit otherwise presents a tri-state condition to the output node. The keeper circuit is coupled to the output node to maintain its state during the tri-state condition.

A method of dynamically registering an output signal according to an embodiment of the present invention includes pre-setting a first node while a clock signal is in a first logic state, dynamically evaluating a logic function to control the logic state of the first node when the clock signal transitions to a second logic state, delaying and inverting the clock signal and providing a delayed inverted clock signal, latching a logic state of an output node based on the logic state of the first node determined during an evaluation period beginning when the clock signal transitions to the second logic state and ending with the next corresponding transition of the delayed inverted clock signal, and maintaining the logic state of the output node between evaluation periods.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for providing registered outputs for logic circuits in which speed is a critical factor. He has therefore developed a dynamic logic register that provides latched inputs and registered outputs for simple to complex logic evaluation functions which is markedly faster than existing configurations, as will be further described below with respect to FIGS. 1–4. When employed in a pipeline architecture that relies heavily on registers to transfer data from stage to stage, a dynamic logic register according to an embodiment of the present invention enables overall device operating speed to be significantly increased.

Figure 1A:
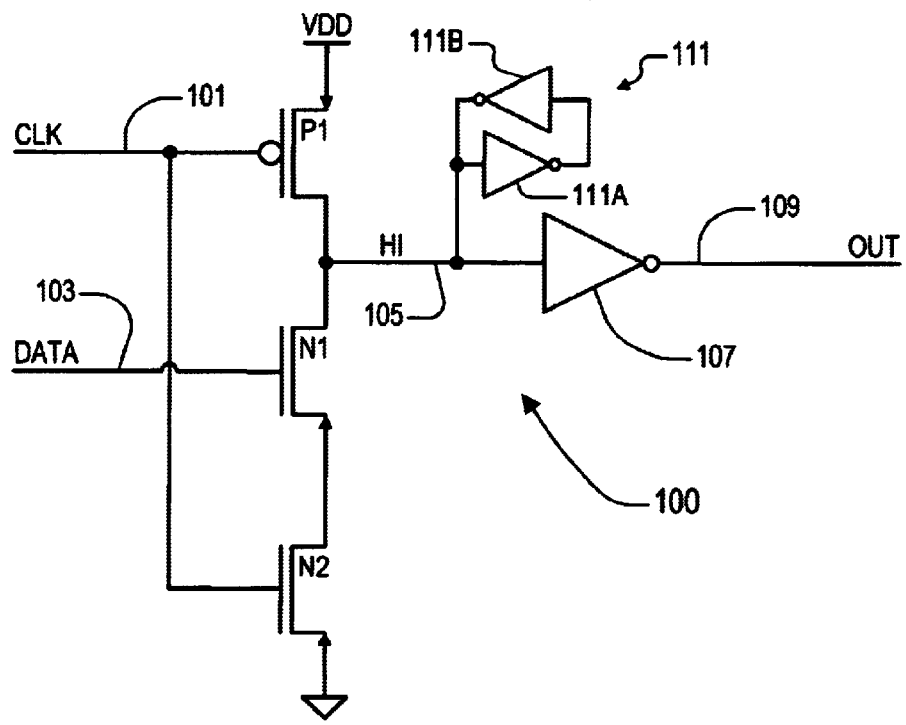
FIG. 1A is a schematic diagram of an exemplary dynamic circuit for illustrating dynamic circuit characteristics.

FIG. 1A is a schematic diagram of an exemplary dynamic circuit 100 for illustrating dynamic circuit characteristics. The dynamic circuit 100 includes an input portion consisting of stacked P-channel and N-channel devices P1, N1 and N2. P1 and N1 are a complementary pair of evaluation devices and N1 is evaluation logic. The source of P1 is coupled to a voltage source VDD and its drain is coupled to a node 105 providing a signal HI. The drain of N1 is coupled to the node 105 and its source is coupled to the drain of N2. The source of N2 is coupled to ground. An input clock signal CLK is provided via a node 101 to the gates of P1 and N2. An input data signal DATA is provided via a node 103 to the gate of N1. The node 105 is coupled to the input of an inverter/buffer 107 having an output coupled to a node 109 providing an output signal OUT. A weak keeper circuit 111 is coupled to the node 105. The keeper circuit 111 includes a first inverter 111A having its input coupled to node 105 for receiving the HI signal and its output coupled to the input of a second inverter 111B, which has its output coupled to node 105.

Figure 1B:
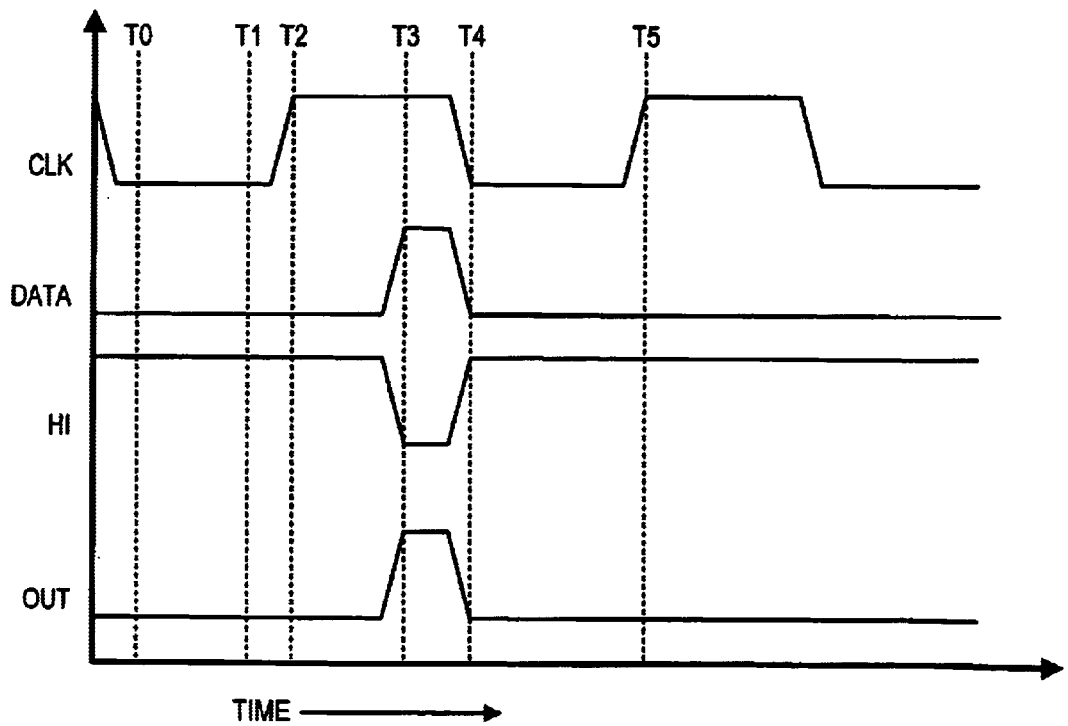
FIG. 1B is a timing diagram illustrating operation of the dynamic circuit of FIG. 1A.

FIG. 1B is a timing diagram illustrating operation of the dynamic circuit 100, in which the CLK, DATA, HI, and OUT signals are plotted versus time. At a time T0 when the CLK signal is low, N2 is turned off and P1 is turned on, which pre-charges the HI signal to a logic high level in preparation for evaluation of the DATA signal upon the rising edge of CLK. During the half cycle when the CLK signal is low, the OUT signal is also asserted low by the inverter 107. Signal DATA is typically low as well during the half cycle when clock is low, as is shown at time T1, because dynamic circuits 100 such as that shown in FIG. 1A are typically configured in a cascaded arrangement with a preceding circuit's OUT signal connected to a subsequent circuit's DATA signal. Hence at time T1, because the DATA signal is at a logic low level, N1 is turned off.

At subsequent time T2, the CLK signal is asserted high which turns N2 on and P1 off. Since the DATA signal is low at time T2, N1 is off so that the HI signal is not driven by the input portion. During this time, however, the keeper circuit 111 maintains the high logic level of the HI signal and the inverter 107 maintains the OUT signal low. If the DATA signal is driven to a high logic level during the half cycle while the CLK signal is high, as shown at subsequent time T3, N1 turns on while N2 is on, which overpowers the keeper circuit 111 so that the HI signal is discharged to a low logic level. The inverter 107 responds by driving the OUT signal high.

The CLK signal subsequently goes low and the DATA signal is also driven low at time T4. The HI signal is pre-charged high once again by P1, and the OUT signal is pulled low. At subsequent time T5, the CLK signal is once again asserted high while DATA is low, so that N2 is turned on, yet N1 is turned off. The HI signal, thus, is not discharged and the OUT signal is remains low. One skilled in the art will appreciate, however, that driving DATA high at any point during the half cycle of CLK following time T5 would cause signal HI to discharge and would cause signal OUT to be driven low.

Dynamic circuits, exemplified by the dynamic circuit 100 of FIG. 1A, are faster than other circuit configurations that are designed to accomplish the same logic evaluation function, including static implementations, because the output of dynamic circuits is already preset (e.g., pre-charged) to one logic state. Note that while CLK is low, the HI signal is pre-charged high so that the OUT signal is pre-charged low. Data setup time is virtually eliminated because clocking mechanisms (e.g., P1, N2) are integrated with evaluation logic (e.g., N1). One of ordinary skill in the art will appreciate that more complex evaluation logic (e.g. a multiple input mux) can be substituted for the simple evaluation logic device N1 shown in the dynamic circuit 100 without adversely impacting its speed or its associated power constraints.

Although dynamic circuits are fast, they heretofore have not provided for a latching mechanism on the input DATA signal or a registering mechanism for the OUT signal. And as allude to above, the OUT signal can change from low to high in response to the DATA signal changing from low to high after initially being evaluated low during the half cycle while the CLK signal is still high. This is why pipeline logic designers have been required to provide registered inputs for existing dynamic circuits.

Figure 2A:
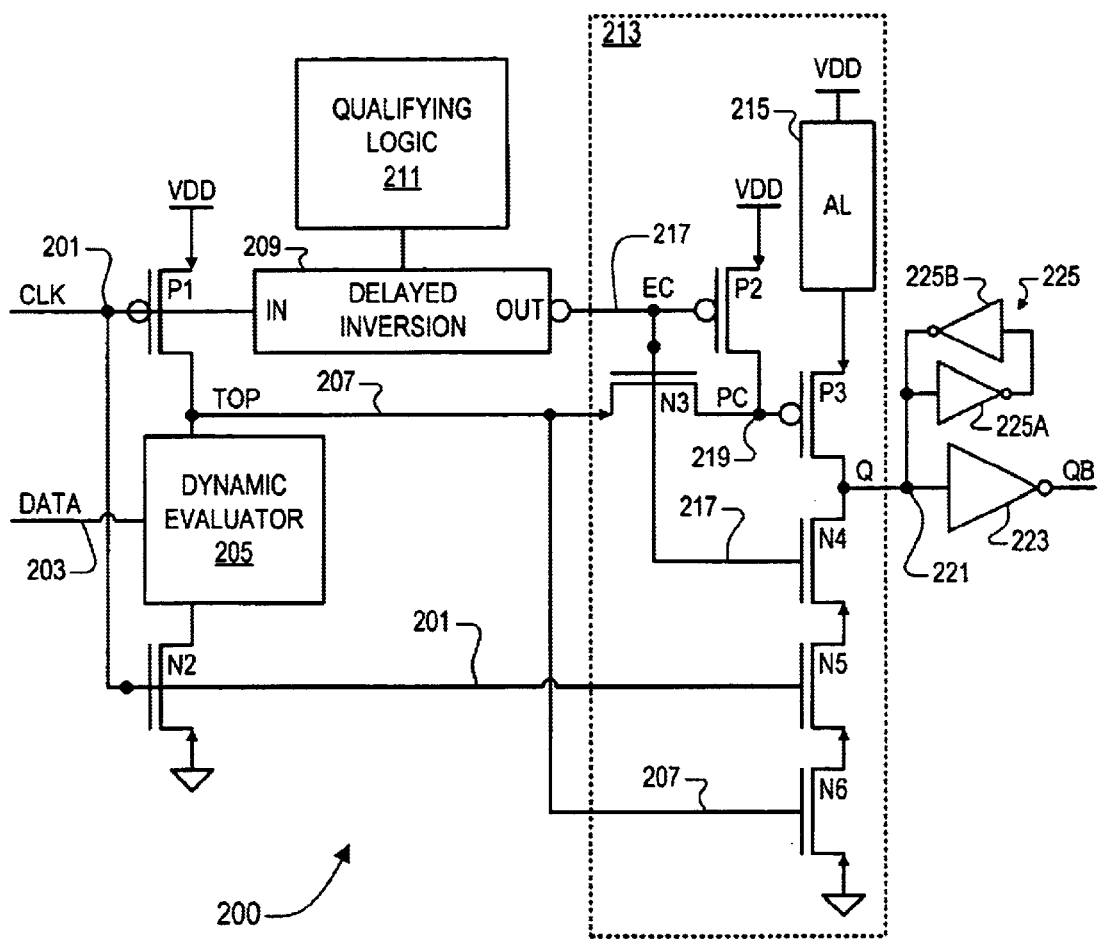
FIG. 2A is a schematic diagram of a dynamic logic register implemented according to an exemplary embodiment of the present invention.

FIG. 2A is a schematic diagram of a dynamic logic register 200 implemented according to an exemplary embodiment of the present invention. The input portion of the dynamic logic register 200 includes a P-channel device P1 and an N-channel device N2 configured as a complementary pair of evaluation devices in a similar manner as that of the dynamic circuit 100. The source of P1 is coupled to VDD and its drain is coupled to a pre-charge node 207 providing a signal TOP. The N-channel device N1 of the dynamic circuit 100, however, is replaced by a dynamic evaluator circuit 205. The dynamic evaluator circuit 205 is coupled between the node 207 and the drain of N2, which has its source coupled to ground. The dynamic evaluator circuit 205 can be as simple as the device N1. In alternative and more complex embodiments, the dynamic evaluator circuit 205 is a more complex configuration of evaluation logic that "evaluates" by pulling the TOP signal low when the CLK signal is high. Also, although a single data signal (DATA) is shown being evaluated, those of ordinary skill in the art will appreciate that any number of data signals may be used during the evaluation process. The dynamic evaluator circuit 205 performs or otherwise evaluates a logic function, which may range from very simple to very complex.

The input clock signal CLK is provided via a node 201 to the gates of P1 and N2, to an input of delayed inversion logic 209 and to the gate of an N-channel device N5. The input DATA signal is provided via a node 203 to an input of the dynamic evaluator circuit 205. The node 207 is coupled to the gate of an N-channel device N6. The drain of N6 is coupled to the source of N5 and the source of N6 is coupled to ground. Qualifying logic 211 is coupled to the delayed inversion logic 209 as further described below.

Latching logic 213 includes P-channel devices P2 and P3, N-channel devices N3, N4, N5 and N6, and additional logic (AL) 215. The output of the delayed inversion logic 209 is coupled to a node 217 providing an evaluation complete signal EC, where the node 217 is coupled to the gates of P2, N3, and N4. The source of P2 is coupled to VDD. The node 207 is coupled to the source of the N-channel pass device N3, which has its drain coupled to a pull-up control node 219 providing a pull-up control signal PC. The node 219 is coupled to the drain of P2 and to the gate of P3. The additional logic 215 is coupled between VDD and the source of P3. The drain of P3 is coupled to the drain of N4 at an output (or preliminary output) node 221 providing an output signal Q. The source of N4 is coupled to the drain of N5. A keeper circuit 225 is coupled to the node 221, where the keeper circuit 225 includes a first inverter 225A having its input coupled to the node 221 for receiving the Q signal and its output coupled to the input of a second inverter 225B, which has its output coupled to the node 221. In one embodiment, the keeper circuit 225 is a relatively weak keeper circuit that is over-powered by either the pull-up device P3 or the stack of pull-down devices N4–N6.

The node 221 is coupled to the input of an inverter/buffer 223 having an output generating an inverted output signal QB. Buffering is advantageous to drive the input of subsequent logic or latches since the stack of devices P3 and N4–N6 often present a tri-state condition to the node 221 and the inverter 225B is intentionally a relatively weak device. The inverter/buffer 223 may be replaced by a non-inverting buffer to prevent logic inversion. A non-inverting buffer, however, is often implemented with back-to-back inverters, which may add undesired delay and increase the clock to output time delay.

Figure 2B:
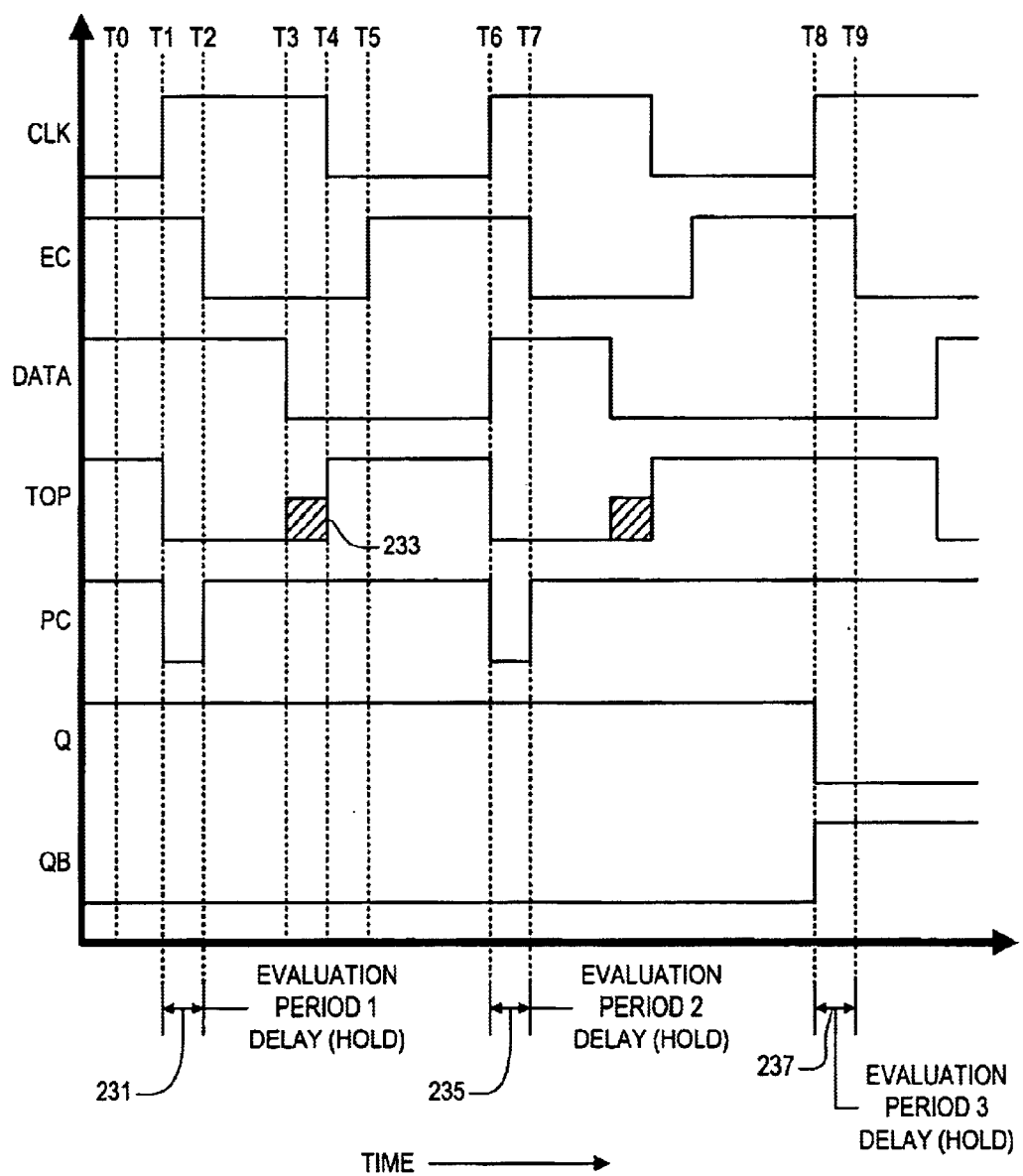
FIG. 2B is a timing diagram illustrating operation of the dynamic logic register of FIG. 2A.

FIG. 2B is a timing diagram illustrating operation of the dynamic logic register 200, in which the CLK, EC, DATA, TOP, PC, Q and QB signals are plotted versus time. At a time T0, the TOP signal is pre-charged to a high logic level when the CLK signal is low in a similar manner as the HI signal of the dynamic circuit 100. The EC signal is a delayed and inverted version of the CLK signal. Prior to the CLK signal going low, however, the EC signal is low. Thus, P2 is on, and N3 and N4 are off, and signal PC is high. The EC signal is driven high after the CLK signal is driven low, turning off P2 and turning on N3 and N4, thus sustaining the high level on the PC signal via propagating the TOP signal through N3. P3 and N5 are off providing a tri-state condition to the Q signal, which is maintained at its previous state by the keeper circuit 225. In the case illustrated, the Q signal is initially in a high logic state at time T0, and the QB signal is low. The DATA signal is shown as being initially high.

An evaluation period begins upon each rising edge of the CLK signal and ends on the next falling edge of EC signal. The EC signal may also be thought of or otherwise referred to as an inverted delayed clock signal. The duration of the evaluation period is defined by the amount of delay through the delayed inversion logic 209. The CLK signal rises at subsequent time T1, turning off P1 and turning on N2 and N5 initiating a first evaluation period shown at 231. The state of the TOP signal during the evaluation period depends upon evaluation of the DATA signal by the dynamic evaluator circuit 205. In the illustrated embodiment of the dynamic evaluator circuit 205, the DATA signal being high at time T1 causes the dynamic evaluator circuit 205 to evaluate pulling TOP low during the evaluation period 231, which turns N6 off. Since the EC signal is still high during the evaluation period 231, the state of TOP is propagated through N3 to the PC signal, which also goes low turning on P3. Assuming that the additional logic 215 presents VDD to the source of P3 during the evaluation period, the Q signal is pulled high (or otherwise stays high) and the QB signal is pulled low (or otherwise stays low).

At time T2 upon expiration of the delay period through the delayed inversion logic 209, the EC signal goes low turning off N3 and N4 and turning on P2. At time T2, when signal EC goes low, the evaluation period is over. At any point following time T2, the state of the DATA signal can change without affecting the output QB of the circuit 200. Hence, at time T2, the PC signal is pulled high again by VDD via P2, so that P3 is turned off. The keeper circuit 225 keeps the Q signal high during the remainder of the half-cycle while CLK is high, and the inverter 223 maintains the QB signal at the logic low level. For illustration purposes, d FIG. 2a depicts the DATA signal goes low at time T3. Since N2 is still on, the state of the TOP signal is temporarily indeterminate or otherwise unknown as shown by the shaded region 233. The actual state or states of the TOP signal during this time is determined by the composition of the dynamic evaluator circuit 205. At subsequent time T4, the next falling edge of the CLK signal occurs, which turns N2 off and P1 back on so that the TOP signal is once again pre-charged by VDD via P1. Regardless of the transitions of the DATA and TOP signals from time T3 to time T4, since the EC signal remains asserted low, N3 and N4 are off and the PC signal is pulled high keeping P3 off, so that the states of the Q and QB signals are held stable and unchanged by the keeper circuit 225 and the inverter 223.

N5 is turned off by the CLK signal going low at time T4. N3 is turned on by the EC signal going high at time T5, so that the high state of TOP is once again propagated to the PC signal via the pass device N3, which keeps the PC signal high and P3 off. Although N4 is turned on, since N5 is now off, the Q and QB signal remain stable and unchanged.

Operation is substantially identical beginning on the next rising edge of the CLK signal at time T6. In this case, however, the DATA signal, which was high at the previous rising edge of the CLK signal, is low and then asserted high at approximately the same time as the CLK signal at time T6. Since the DATA signal is high during the second evaluation period shown at 235 from time T6 to subsequent time T7 when the EC signal goes low, the DATA signal is properly evaluated by the operation of the dynamic evaluator circuit 205 with sufficient time so that the Q and QB signals are asserted to the proper state. In this manner, it is appreciated by those of ordinary skill in the art that the setup time is effectively zero since the logic function is successfully evaluated even though the DATA signal transitions at approximately the same time as the CLK signal initiating the evaluation period.

Operation is similar during the third evaluation period shown at 237 between the next rising edge of the CLK signal at time T8 until the subsequent falling edge of the EC signal at time T9. In this case, however, the DATA signal is asserted at a logic low level, so that the dynamic evaluator circuit 205 fails to evaluate and the TOP signal remains high keeping N6 turned on. Since the EC signal is still high, N3 is on and the high state of TOP is propagated to the PC signal keeping P3 off. The CLK signal turns N5 on and N4 remains turned on by the EC signal during the third evaluation period 237, so that the Q signal is discharged to a low logic level at approximately time T8 via the stack of pull-down devices N4, N5 and N6. The QB signal is asserted high by the inverter 223 at approximately time T8. When the EC signal goes low at time T9, the PC signal is pulled high (or otherwise remains high) by VDD via P2, and N4 is turned off. Thus, the P3 and N4 devices present a tri-state condition to the Q signal once again upon expiration of the evaluation period. The state of the Q signal is nonetheless maintained for the remaining portion of the cycle by the keeper circuit 225 in a similar manner as previously described. In this manner, the Q and QB signals switch during the evaluation period and remain stable for the duration of the CLK cycle after expiration of the evaluation period.

Registering is accomplished at the expiration of the evaluation period when the EC signal goes low via the latching logic 213. The EC signal going low shuts off N3 and N4 and turns on P2, which pulls the PC signal high turning off P3. Thus, the Q signal is isolated from the pull-up device P3 and the stack of pull-down devices N4–N6 during the first half of the clock cycle while the CLK signal is high. When the CLK signal goes low initiating the second half of the clock cycle, N5 turns off and while the EC signal is still low and P3 remains off as well thereby preserving the state of the Q signal (which remains isolated from the pull-up and pull-down devices). Concurrently, P1 turns on and N2 turns off, thus pre-charging the TOP signal to a logic high. Following pre-charging of the TOP signal, the EC signal goes high, turning on N3 and N4, thus allowing the high state of TOP to sustain the high level on the PC signal. Upon expiration of the pre-charge period when the EC signal goes high, N3 turns on, allowing the high state of the TOP signal to propagate through to the PC signal, thus keeping P3 turned off. Thus, the states of the Q and QB signals are maintained by the keeper circuit 225 from the expiration of each evaluation period to the beginning of the next evaluation period regardless of changes of the input data signals.

The additional logic 215 enables functions that can override or otherwise prevent logic high outputs on the Q signal. The qualifying logic 211 is coupled to or otherwise integrated into the delayed inversion logic 209 to effectively disable the EC signal from ever going high when the CLK signal goes high, thus preventing the TOP signal representing the evaluated logic function from ever propagating through N3 to the output QB. Functionally, this enables a designer to preserve a preceding state of the Q and QB signals during subsequent clock cycles, if desired.

The additional logic 215 is a significant feature of the present invention because more complex functionality can be added to the overall circuit 200 than would be otherwise provided for in a conventional dynamic circuit. P3 is configured as an evaluate strobe for the additional logic 215 in a manner similar to that described with reference to device N2 providing an evaluate strobe for the dynamic evaluator 205. Accordingly, one skilled in the art will appreciate that while the dynamic evaluator 205 is evaluated during the evaluation period, the circuit 200 according to the present invention is also configured advantageously to evaluate the additional logic 215 during the evaluation period. The additional logic 215 is evaluated when the PC signal is low (i.e., device P3 is on). Consequently, an entirely independent and complex logic function can be implemented in P logic to comprise the additional logic 215. Not only does the present invention provide for registering of evaluations performed by the dynamic evaluator 205, but also of evaluations performed by the additional logic 215.

Once skilled in the art will appreciate that it is advantageous to implement parallel P devices in the additional logic 215, which are the equivalent of series N devices in the dynamic evaluator 205. Thus, complex AND-OR functions can be implemented according to the present invention without incurring the problems associated with stacked series devices such as body effect, etc.

Figure 3:
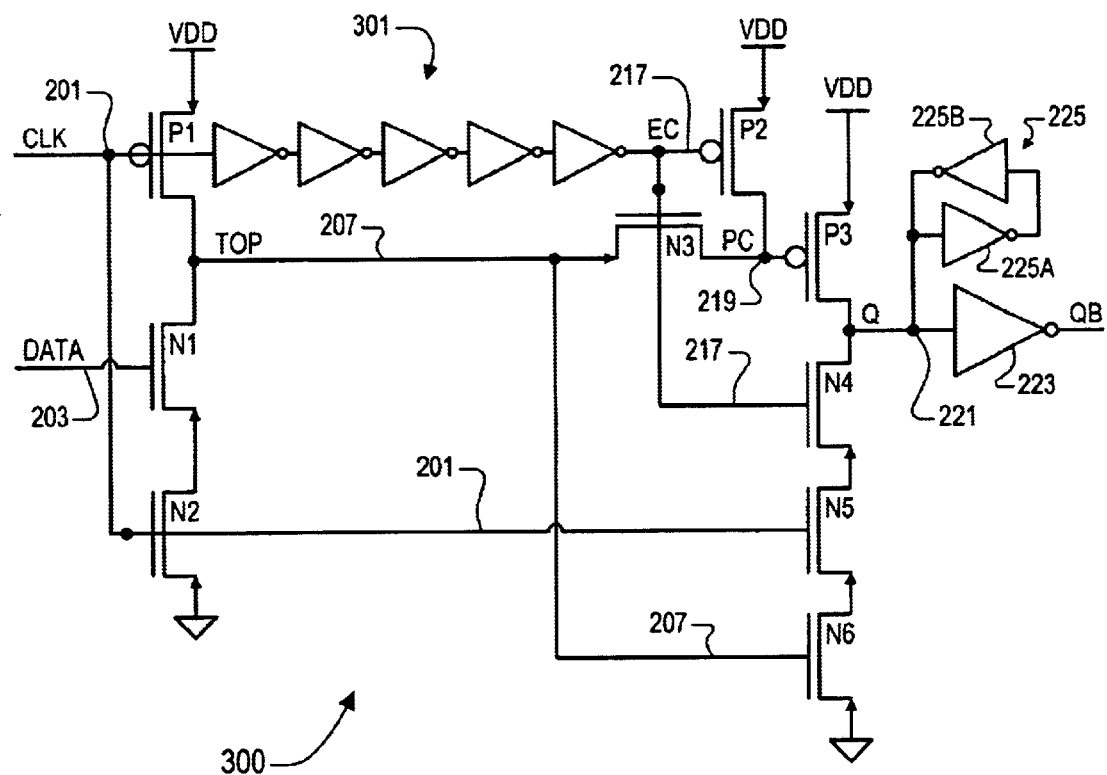
FIG. 3 is a schematic diagram of a simple fast dynamic register, which is similar in configuration and operation to the dynamic logic register of FIG. 2A.

FIG. 3 is a schematic diagram of a simple fast dynamic register 300, which is similar to the dynamic logic register 200, except that dynamic evaluator circuit 205 is replaced with the single N-channel device N1, the delayed inversion logic 209 is replaced with a series chain of five inverters 301 and the qualifying logic 211 and the additional logic 215 are eliminated. It is understood that qualifying logic and/or additional logic may be added to the simple fast dynamic register 300 with no significant affect whatsoever on the setup or data-to-output times. In one specific embodiment employing a 0.15 micron fabrication process for implementing the simple fast dynamic register 300, the series chain of five inverters 301 collectively yields an evaluation period of approximately 100 picoseconds (ps), the setup time is zero and the clock-to-out response is approximately 60 ps.

Figure 4:
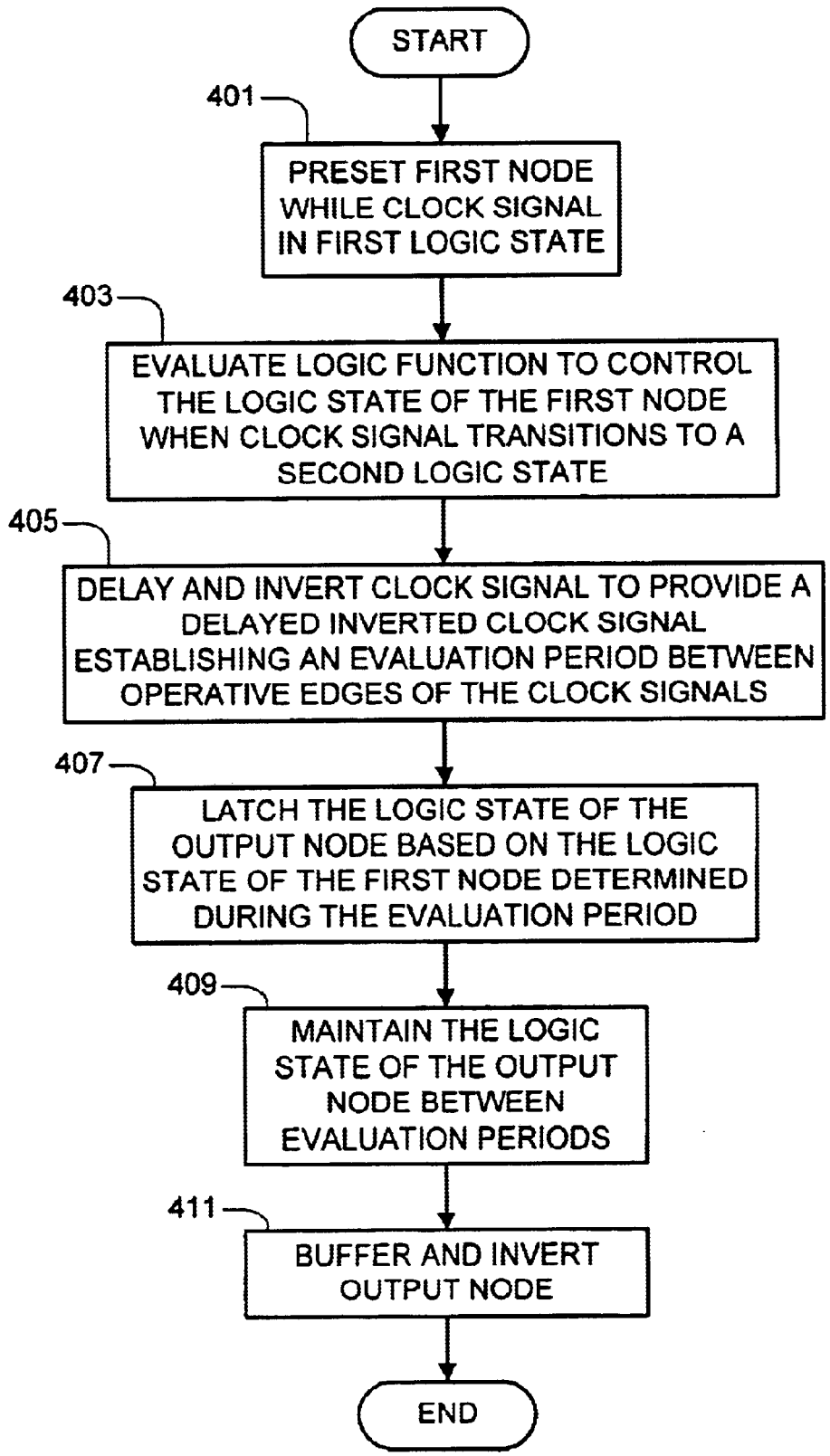
FIG. 4 is a flowchart diagram illustrating a method of dynamically registering an output signal according to an exemplary embodiment of the present invention.

FIG. 4 is a flowchart diagram illustrating a method of dynamically registering an output signal according to an exemplary embodiment of the present invention. Operation begins at a first block 401 in which a first node is preset while a clock signal is in a first logic state. In the exemplary embodiments previously described, for example, node 207 providing the TOP signal is pre-charged to a high logic state while the CLK signal is low. Operation proceeds to next block 403, in which a logic function is evaluated to control the logic state of the first node when the clock signal transitions to a second logic state. Continuing the previous example, the dynamic evaluator 205 evaluates a logic function based on one or more input data signals when the clock signal is asserted high. The logic function is said to evaluate when the TOP signal is discharged low, or is otherwise said to fail to evaluate if the TOP signal remains asserted high.

At next block 405, the clock signal is delayed and inverted to provide a delayed inverted clock signal. For example, the delayed inversion logic 209 delays the CLK signal to provide the EC signal. The duration of the clock delay can be configured to provide the minimum delay necessary to ensure completion of evaluation of the logic function being evaluated. In a synchronous pipeline architecture, such as a pipeline microprocessor or the like, the delays of the stages might be varied depending upon the corresponding logic function of each stage. Alternatively, a common delay may be determined based on the minimum time necessary to evaluate the longest-duration logic evaluation required in the series of stages. The duration of the delay establishes an evaluation period beginning with the operative transition of the clock signal (e.g., the rising edge of CLK), and the corresponding next transition of the inverted delayed clock signal (e.g., the next falling edge of EC).

At next block 407, the logic state of the output node is latched based on the logic state of the first node as determined during the evaluation period. With reference to the dynamic logic register 200, the Q signal is latched low if TOP remains high during the evaluation period, and is latched high if TOP is pulled low during the evaluation period. At next block 409, the logic state of the output node (e.g., the Q signal) is maintained between the expiration of each evaluation period and the beginning of the next evaluation period. In this manner, once the logic state is determined upon the expiration of each evaluation period, the state of the output is maintained until the next evaluation period to ensure the integrity of the output signal regardless of fluctuations of input data signals. At final block 411, the output node is buffered and inverted to drive subsequent inputs.

A dynamic logic register according to an embodiment of the present invention provides the speed and evaluation configurability of a dynamic circuit with a significantly reduced input data hold time, along with the output data retention properties of a register. It also exhibits a zero setup time, a very short hold time, and a nominal clock-to-output time, thus making it much faster than configurations in which a logical evaluator is preceded and followed by latches. A delayed and inverted version of the CLK signal (e.g., the EC signal) combined with a latching mechanism provides a relatively short evaluation interval during which the output of the dynamic evaluator (e.g., the TOP signal) is allowed to propagate to a preliminary output node (e.g., the Q signal). Following the evaluation interval, the output stack devices (e.g., P3, N4, N5, and N6) operate together during the remaining half clock cycle when the CLK signal is high and the following half cycle when CLK is low and high to present a tri-state condition to the preliminary output node. A keeper circuit maintains the state of the preliminary output node that was presented during the evaluation interval. A buffer or inverter or the like drives an output signal based on the state of the preliminary output node.

A dynamic logic registering mechanism according to an embodiment of the present invention provides for input latching and output registration of complex logic evaluation functions. In addition, since the present invention eliminates the setup time requirement normally seen in LATCH-LOGIC-LATCH configurations, the resulting data-to-output characteristic is significantly reduced. The dynamic logic registering mechanism provides latched inputs and registered outputs for simple to complex logic evaluation functions that are markedly faster than present day configurations. When employed in a pipeline architecture that relies heavily on registers to transfer data from stage to stage, the present invention enables overall device operating speed to be significantly increased.

Although the present invention has been described in considerable detail with reference to certain preferred versions thereof, other versions and variations are possible and contemplated. For example, the dynamic evaluator circuit can be as simple or as complex as desired. The qualifying logic 211 and the additional logic 215 may be omitted or otherwise implemented in any suitable manner as understood by those of ordinary skill in the art. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A dynamic logic register, comprising:
   a complementary pair of evaluation devices responsive to a clock signal;
   a dynamic evaluator, coupled between said complementary pair of evaluation devices at a pre-charged node, that evaluates a logic function based on at least one input data signal;
   delayed inversion logic that receives said clock signal and that outputs a complete signal being a delayed and inverted version of said clock signal;
   latching logic, responsive to said clock and complete signals and the state of said pre-charged node, that controls the state of an output node based on the state of said pre-charged node during an evaluation period between an operative edge of said clock signal and the next edge of said complete signal and that otherwise presents a tri-state condition to said output node; and
   a keeper circuit coupled to said output node.

2. The dynamic logic register of claim 1, wherein said complementary pair of evaluation devices comprises:
   a P-channel device having a gate receiving said clock signal and a drain and source coupled between a source voltage and said pre-charged node; and
   an N-channel device having a gate receiving said clock signal and a drain and source coupled between said dynamic evaluator and ground.

3. The dynamic logic register of claim 1, wherein said dynamic evaluator comprises a complex logic circuit.

4. The dynamic logic register of claim 1, wherein said delayed inversion logic comprises at least one inverter.

5. The dynamic logic register of claim 1, wherein said delayed inversion logic comprises a series chain of inverters.

6. The dynamic logic register of claim 1, further comprising qualifying logic coupled to said delayed inversion logic and operative to preserve a preceding state of said output node.

7. The dynamic logic register of claim 1, wherein said latching logic comprises:

an N-channel pass device having a gate receiving said complete signal and a drain and source coupled between said pre-charged node and a pull-up control node;

a first P-channel pull-up device having a gate receiving said complete signal and a drain and source coupled between a source voltage and said pull-up control node;

a second P-channel pull-up device having a gate coupled to said pull-up control node and a drain and source coupled between said source voltage and said output node; and a plurality of N-channel pull-down devices coupled between said output node and ground and controlled by said complete signal, said clock signal and said pre-charged node.

8. The dynamic logic register of claim 7, wherein said plurality of N-channel pull-down devices comprises:

a first N-channel pull-down device having a gate receiving said complete signal, a drain coupled to said output node, and a source;

a second N-channel pull-down device having a gate receiving said clock signal, a drain coupled to said source of said first N-channel pull-down device, and a source; and a third N-channel pull-down device having a gate coupled to said pre-charged node, a drain coupled to said source of said second N-channel pull-down device, and a source coupled to ground.

9. The dynamic logic register of claim 7, further comprising additional logic coupled between said source voltage and said second P-channel pull-up device operative to prevent a selected state of said output node.

10. The dynamic logic register of claim 1, further comprising an output buffer/inverter having an input coupled to said output node and an output coupled to an inverted output node.

11. A dynamic latch circuit, comprising:

a dynamic circuit that pre-charges a first node while a clock signal is low and that evaluates a logic function for controlling the state of the first node when said clock signal goes high;

a delayed inverter receiving said clock signal that provides an inverted delayed clock signal;

a latching circuit, coupled to said dynamic circuit and said delayed inverter, that controls the state of an output node based on the state of said first node during an evaluation period beginning when said clock signal goes high and ending when said inverted delayed clock signal next goes low, and that otherwise presents a tri-state condition to said output node; and a keeper circuit coupled to said output node.

12. The dynamic latch circuit of claim 11, wherein said dynamic circuit comprises:

a P-channel device coupled to said first node that pre-charges said first node while said clock signal is low;

a logic circuit, coupled to said first node, that evaluates said logic function; and an N-channel device, coupled to said logic circuit, that enables said logic circuit to evaluate said logic function when said clock signal goes high.

13. The dynamic latch circuit of claim 11, wherein said delayed inverter comprises a series chain of inverters.

14. The dynamic latch circuit of claim 11, wherein said latching circuit comprises:

an N-channel device that couples a second node to said first node when said inverted delayed clock signal is high;

a P-channel device that pulls said second node high while said inverted delayed clock signal is low; and a stack of devices coupled to said output node, including a pull-up device that pulls said output node high when said second node is low and a plurality of pull-down devices that pull said output node low during said evaluation period if said first node is high.

15. The dynamic latch circuit of claim 11, further comprising qualifying logic coupled to said delayed inverter and additional logic provided within said latching circuit to prevent a predetermined logic state of said output node.

16. A method of dynamically registering an output signal, comprising:

pre-setting a first node while a clock signal is in a first logic state;

dynamically evaluating a logic function to control the logic state of the first node when the clock signal transitions to a second logic state;

delaying and inverting the clock signal and providing a delayed inverted clock signal;

latching a logic state of an output node based on the logic state of the first node determined during an evaluation period beginning when the clock signal transitions to the second logic state and ending with the next corresponding transition of the delayed inverted clock signal; and maintaining the logic state of the output node between evaluation periods.

17. The method of claim 16, wherein said pre-setting a first node comprises pre-charging the first node to a high logic state.

18. The method of claim 16, further comprising buffering and inverting the output node.

19. The method of claim 16, wherein said maintaining the logic state of the output node comprises presenting a tri-state condition to the output node and coupling a keeper circuit to the output node.

20. The method of claim 16, the first logic state being a low logic state and the second logic state being a high logic state, wherein said latching a logic state of an output node comprises:

passing a logic state of the first node to a pull-up control node while said delayed inverted clock signal is in a high logic state;

pulling the pull-up control node to a high logic state while said delayed inverted clock signal is in a low logic state;

pulling the output node to a high logic state if the pull-up control node is in a low logic state; and pulling the output node to a low logic state if the first node is in a high logic state during an evaluation period.

* * * * *